(12) United States Patent
Igarashi

(10) Patent No.: US 6,834,006 B2
(45) Date of Patent: Dec. 21, 2004

(54) METHOD AND CIRCUIT FOR READING DATA FROM A FERROELECTRIC MEMORY CELL

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 13 days.

(21) Appl. No.: 10/247,375

(22) Filed: Sep. 20, 2002

(65) Prior Publication Data

US 2003/0076117 A1 Apr. 24, 2003

(30) Foreign Application Priority Data

Oct. 22, 2001 (JP) ........................................ 2001-323457

(51) Int. Cl.[7] .............................................. G11C 11/22

(52) U.S. Cl. ....................................... 365/145; 365/203

(58) Field of Search ................................ 365/145, 203, 365/189.09, 189.01

(56) References Cited

U.S. PATENT DOCUMENTS 6,118,688 A * 9/2000 Hirano et al. ................ 365/145
6,157,563 A * 12/2000 Hirano et al. ................ 365/145

FOREIGN PATENT DOCUMENTS

| | | |
|---|---|---|
| EP | 0 928 004 A2 | 7/1999 |
| JP | 11-260066 | 9/1999 |
| JP | 2001143478 | 5/2001 |

* cited by examiner

Primary Examiner—Vu A. Le
(74) Attorney, Agent, or Firm—Volentine Francos & Whitt, PLLC

(57) ABSTRACT

Data stored in a ferroelectric capacitor in a ferroelectric memory cell are read by applying a preliminary voltage to the ferroelectric capacitor to increase its polarization if a certain data value is stored, then applying a series of read voltages to produce a potential responsive to the stored data. The preliminary voltage may be applied either before or after one terminal of the ferroelectric capacitor is placed in a floating state, which is maintained while the series of read voltages is applied. Application of the preliminary voltage provides an increased reading margin if the ferroelectric capacitor has partially lost polarization while storing the certain data value, by restoring some of the lost polarization.

18 Claims, 8 Drawing Sheets

METHOD AND CIRCUIT FOR READING DATA FROM A FERROELECTRIC MEMORY CELL

BACKGROUND OF THE INVENTION

1. Field of the Invention

The present invention relates to a ferroelectric memory, and more particularly to a method and circuit for reading data from a ferroelectric memory.

2. Description of the Related Art

A ferroelectric memory is a semiconductor device that stores data in ferroelectric capacitors. FIG. 6 shows one ferroelectric memory cell Mfe and its associated circuits in a conventional ferroelectric memory. The associated circuits include a bit-line driver BLDu, a plate-line driver PLDu, a sense amplifier SA, and a control circuit CTLu.

The memory cell Mfe comprises a ferroelectric capacitor CFe and a selection transistor SLTr connected in series between a bit line BL and a plate line PL. A ferroelectric memory cell of this type, having a single transistor and a single capacitor, is referred to as a 1T1C memory cell. The ferroelectric capacitor can be positively or negatively polarized by an applied voltage, and the polarization remains after the voltage is removed, enabling information to be stored in a nonvolatile manner. The stored information is read by placing the bit line BL in an electrically floating state, manipulating the plate-line potential, and comparing the bit-line potential with a reference potential.

Many previous ferroelectric memories used dummy ferroelectric capacitors to generate reference potentials precisely matched to the electrical characteristics of different memory cells. Japanese Unexamined Patent Application Publication No. 11-260066 (referred to below as the prior art) describes a method of reading information from a 1T1C ferroelectric memory cell without the need for a precisely matched reference potential or a dummy ferroelectric capacitor. The described method applies a uniform reference potential to both the bit line BL and plate line PL in FIG. 6, then floats the bit line while manipulating the plate-line potential in a way that decreases the positive or negative polarization of the ferroelectric capacitor CFe without changing the sign of the polarization. Finally, the plate line PL is returned to the reference potential and the potential of the bit line BL is compared with the reference potential. Depending on the sign of the polarization of the ferroelectric capacitor CFe, the bit-line potential will be higher or lower than the reference potential.

To enable the ferroelectric memory cell in FIG. 6 to be read by this prior-art method, the bit-line driver BLDu includes a pre-charger PREu and a switch circuit SW. When the switch circuit SW is turned on, the pre-charger PREu drives the bit line BL to a ground potential Vee (=0 V), then to the reference potential Vref. The plate-line driver PLDu drives the plate line PL to a power-supply potential Vcc, the above potentials Vee and Vref, and potentials denoted Vh and Vinv that are respectively higher and lower than Vref. The control circuit CTLu controls the operations of the bit-line driver BLDu, plate-line driver PLDu, selection transistor SLTr, and sense amplifier SA, thereby controlling the storing and reading of information in the ferroelectric memory cell.

FIG. 7 is a timing diagram illustrating the reading of data from the ferroelectric memory cell in FIG. 6 by the above method of the prior art. FIG. 8A is a graph illustrating the polarization of the ferroelectric capacitor CFe during the reading operation in FIG. 7 when '0' information is stored; FIG. 8B is a similar graph illustrating the polarization when '1' information is stored. FIG. 8A also illustrates a problem in the prior art.

The symbol r2 in FIGS. 8A and 8B indicates the polarization at timings s2 and s3 in FIG. 7. The symbols r4, r5, and r6 respectively indicate the polarization at timings s4, s5, and s6. The horizontal axis in FIGS. 8A and 8B indicates the voltage VFe across the two terminals TFe1, TFe2 of the ferroelectric capacitor CFe. The vertical axis indicates the degree of positive or negative polarization (+P or −P) of the ferroelectric capacitor CFe; this quantity (expressible in coulombs per square centimeter) is also known as the polarization charge. The outer curves in these drawings are hysteresis curves illustrating transitions that take place when the polarization of the ferroelectric capacitor CFe changes from the positively saturated state to the negatively saturated state and vice versa.

In the reading operation in FIG. 7, after the plate line PL and bit line BL have been brought to the reference potential Vref and the word line WL has been driven to couple the first terminal TFe1 of the ferroelectric capacitor CFe through the selection transistor SLTr to the bit line BL, the bit line BL is placed in an electrically floating state and the potentials Vh, Vinv, and Vref are applied sequentially to the plate line PL at timings s4, s5, and s6, the bit line BL acting as a capacitive load. The diagonal lines in FIGS. 8A and 8B are capacitive load lines for potentials of Vh, Vinv, and Vref on the plate line PL.

In FIGS. 8A and 8B, it assumed that while storing '0' or '1' information, the ferroelectric capacitor CFe has lost some of its polarization, so the point r2 representing the polarization state at timings s2–s3 is located inside the saturation hysteresis curves. The prior-art reading operation will be described under this assumption with reference to FIGS. 6, 7, 8A, and 8B. The inner curves in FIGS. 8A and 8B indicate polarization state transitions that take place during the reading operation.

Timing s0: Start of Reading

At timing s0, Vee (0 V) is applied to the plate line PL by the plate-line driver PLDu. The switch control line SWE is at the low logic level (L) and the switch circuit SW is turned on, so 0 V is applied to the bit line BL by the pre-charger PREu. The word line WL is at the low logic level and the selection transistor SLTr is turned off, so the first terminal TFe1 of the ferroelectric capacitor CFe is in a floating state, electrically disconnected from the bit line BL. The sense amplifier enable line SAE is at the low logic level and the sense amplifier SA is in the high-impedance state, electrically disconnected from the bit line BL.

Timings s1–s2: Both Terminals at Vref

At timing s1, Vref is applied to the bit line BL and plate line PL by the plate-line driver PLDu and pre-charger PREu. At timing s2, the word line WL is driven to the high logic level (H) and the selection transistor SLTr is turned on. The first terminal TFe1 of the ferroelectric capacitor CFe is now coupled through the selection transistor SLTr to the bit line BL, so the two terminals of the ferroelectric capacitor CFe are placed identically at the Vref potential. The polarization at these timings (s2–s3) is indicated by point r2 in FIGS. 8A and 8B. It is assumed that the voltage drop in the selection transistor SLTr is negligible; this assumption is also made in the description below.

Timing s3: Bit Line BL in Floating State

At the next timing s3, the switch control line SWE is set to the high logic level and the switch circuit SW is turned off. This disconnects the pre-charger PREu from the bit line BL, placing the bit line BL in the floating state. The bit line BL remains in the floating state from timing s3 to timing s7.

Timings s4–s6: Read Voltage Sequence

Next, while the bit line BL remains floating, the plate line PL is driven to Vh (>Vref) at timing s4, Vinv (<Vref) at timing s5, and Vref (the same potential as at timing s2) at timing s6 by the plate-line driver PLDu.

Setting the potential VPL of the plate line PL (the potential of the second terminal TFe2 of the ferroelectric capacitor CFe) to Vh at timing s4 creates a positive voltage across the terminals of the ferroelectric capacitor CFe. The polarization state shifts from point r2 to point r4, which is disposed at the intersection of the hysteresis characteristic with the capacitive load line for VPL=Vh. The locus of the state transition from point r2 to point r4 follows a partial polarization hysteresis curve representing the polarization state when '0' information is stored in FIG. 8A, and the polarization state when '1' information is stored in FIG. 8B.

Setting the potential VPL of the plate line PL to Vinv at timing s5 creates a negative voltage across the terminals of the ferroelectric capacitor CFe. The polarization shifts from point r4 to point r5, which is disposed on the capacitive load line for VPL=Vinv.

Returning the potential VPL of the plate line PL to Vref at timing s6 shifts the polarization state from point r5 to point r6, which is disposed on the capacitive load line for VPL=Vref. The voltage VFe across the terminals of the ferroelectric capacitor CFe that may now be either positive or negative. The potential Vread on the bit line BL at timing s6 differs depending on the initial polarization of the ferroelectric capacitor CFe. If the ferroelectric capacitor CFe was initially in a saturated polarization state at timing s0, which is not the case for points r2 to r6 in FIGS. 8A and 8B, then Vread<Vref if the stored data value is '0', and Vread>Vref if the stored data value is '0'.

Timing s7: Sensing of Read Data

At the next timing s7, the sense amplifier enable line SAE is set to the high logic level to activate the sense amplifier SA. The sense amplifier SA compares Vread with the reference potential Vref. If Vread<Vref, the sense amplifier SA outputs a read signal Vdata indicating '0' information and drives the bit line BL to Vee (0 V). If Vread>Vref, the sense amplifier SA outputs a read signal Vdata indicating '1' information and drives the bit line BL to Vcc.

Timings s8–s9: Rewriting of Read Data

While the bit line BL remains latched at Vee or Vcc by the sense amplifier SA, Vcc is applied to the plate line PL at timing s8, and Vee (0 V) at timing s9, by the plate-line driver PLDu, rewriting the read data value into the ferroelectric capacitor CFe and restoring its polarization state to a point on the saturation hysteresis curve.

Timing s10: Inactivation of Sense Amplifier

At the next timing s10, the sense amplifier enable line SAE is set to 0 V to inactivate the sense amplifier SA. The sense amplifier SA sets the bit line BL to 0 V, then enters the high-impedance state.

Timing s11: Inactivation of Word Line

At the next timing s11, the word line WL is set to the low logic level to turn off the selection transistor SLTr, disconnecting the first terminal TFe1 of the ferroelectric capacitor CFe from the bit line BL.

Timing s12: Inactivation of Bit Line

At the next timing s12, the switch control line SWE is set to the low logic level to turn on the switch circuit SW, and Vee (0 V) is applied to the bit line BL by the pre-charger PREu. The sequence of operations from timing s0 to timing s12 completes the reading of the data.

The reading operation from timing s2 to timing s6 makes use of a partial-polarization hysteresis loop disposed inside the saturation hysteresis loop. As can be seen in FIG. 8A, when '0' information is read, if the polarization of the ferroelectric capacitor CFe has been significantly reduced before the read operation starts, so that point r2 is not located on or near the saturation hysteresis curve, the partial-polarization hysteresis loop may be closed: point r6 (at timing s6) may coincide with point r2, making Vread identical to the reference potential Vref and creating an ambiguous read result. Point r2 may even be located above point r6, so that the stored '0' information is unambiguously but incorrectly read as a '1' (Vread>Vref).

After being saturated by a data writing or rewriting operation, an ideal ferroelectric capacitor remains in a state on the saturation polarization hysteresis curve indefinitely, but an actual ferroelectric capacitor loses some polarization charge over time. The cause of this partial loss of polarization lies in the device fabrication process, so it is difficult to reduce the loss to zero. With the method of the above prior art, when such loss of polarization occurs, the margin of error for reading '0' information in particular becomes very small, leading to unstable reading performance.

In general, ferroelectric capacitor manufacturing methods or device structures that lead to partial loss of polarization while data are stored can make it difficult to read the data. This is particularly true in the prior art described above, in which the reading operation is carried out by shifting the polarization state away from the saturation polarization hysteresis curve and using a partial polarization curve; if the ferroelectric capacitor has already lost some of its polarization before the reading operation starts, reliable reading may become impossible.

SUMMARY OF THE INVENTION

An object of the present invention is to provide a method and circuit for reading data from a ferroelectric capacitor in a stable manner by securing an adequate reading margin even if the ferroelectric capacitor loses some of its polarization.

The invented method applies a preliminary voltage to the ferroelectric capacitor to increase the polarization of the ferroelectric capacitor if a certain data value is stored therein. Then the invented method applies a series of read voltages to the ferroelectric capacitor, producing a potential responsive to the data stored in the ferroelectric capacitor at a first terminal of the ferroelectric capacitor.

The invented method may place both terminals of the ferroelectric capacitor identically at a reference potential after applying the preliminary voltage, then leave the first terminal in an electrically floating state while applying the series of read voltages to the second terminal. Alternatively, it is possible to begin by placing both terminals of the ferroelectric capacitor at the reference potential, then leave the first terminal in the floating state while applying the preliminary voltage and the series of read voltages to the second terminal.

The series of read voltages includes, for example, a first read voltage having a polarity opposite to the preliminary voltage, and a second read voltage having a polarity opposite to the first read voltage. Following application of the second read voltage in this case, the second terminal of the ferroelectric capacitor is placed at the reference potential, and the reference potential is compared with the resulting potential at the first terminal.

The invention also provides a circuit for reading data stored in a ferroelectric capacitor in a ferroelectric memory cell by the invented method, by application of appropriate potentials to the two terminals of the ferroelectric capacitor.

If the ferroelectric capacitor has lost some of its polarization while storing the above-mentioned certain data value, application of the preliminary voltage to the ferroelectric capacitor improves the reading margin by moving the polarization state closer to the saturation polarization hysteresis curve before the series of read voltages is applied.

DETAILED DESCRIPTION OF THE INVENTION

Figure 1:
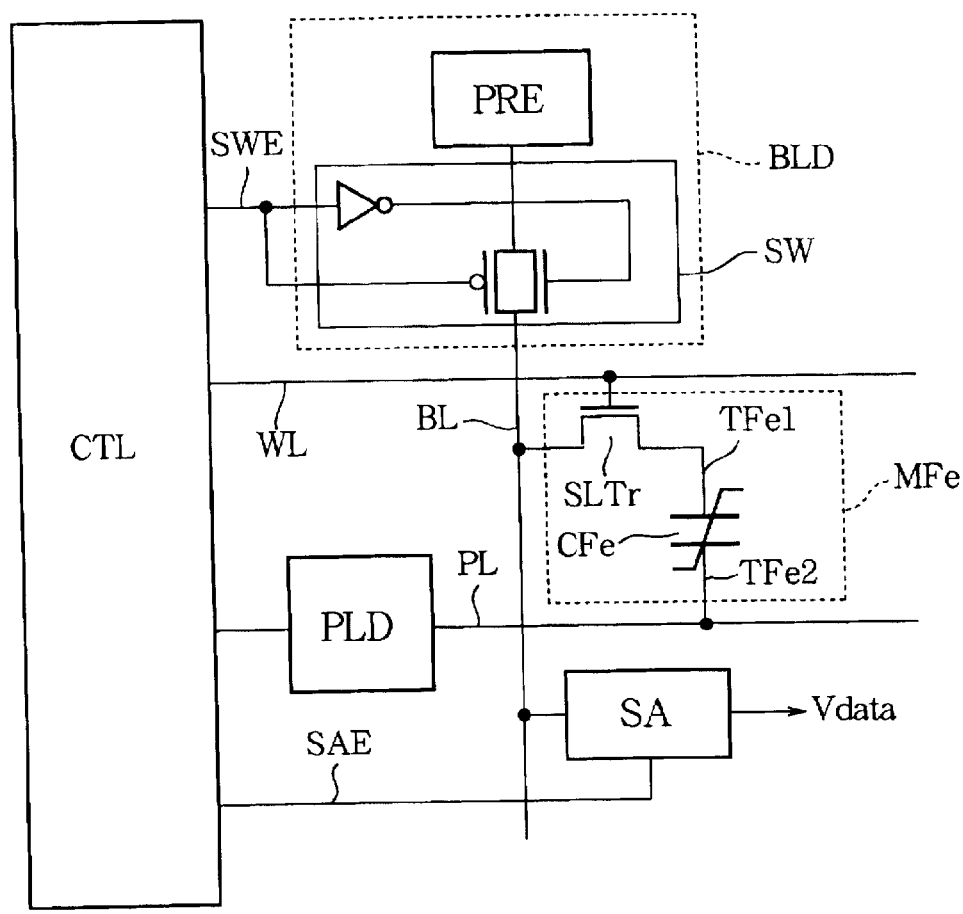
FIG. 1 is a circuit diagram illustrating a ferroelectric memory according to a first embodiment of the invention.

Embodiments of the invention will be described with reference to the attached drawings, in which like parts are indicated by like reference characters.

Figure 6:
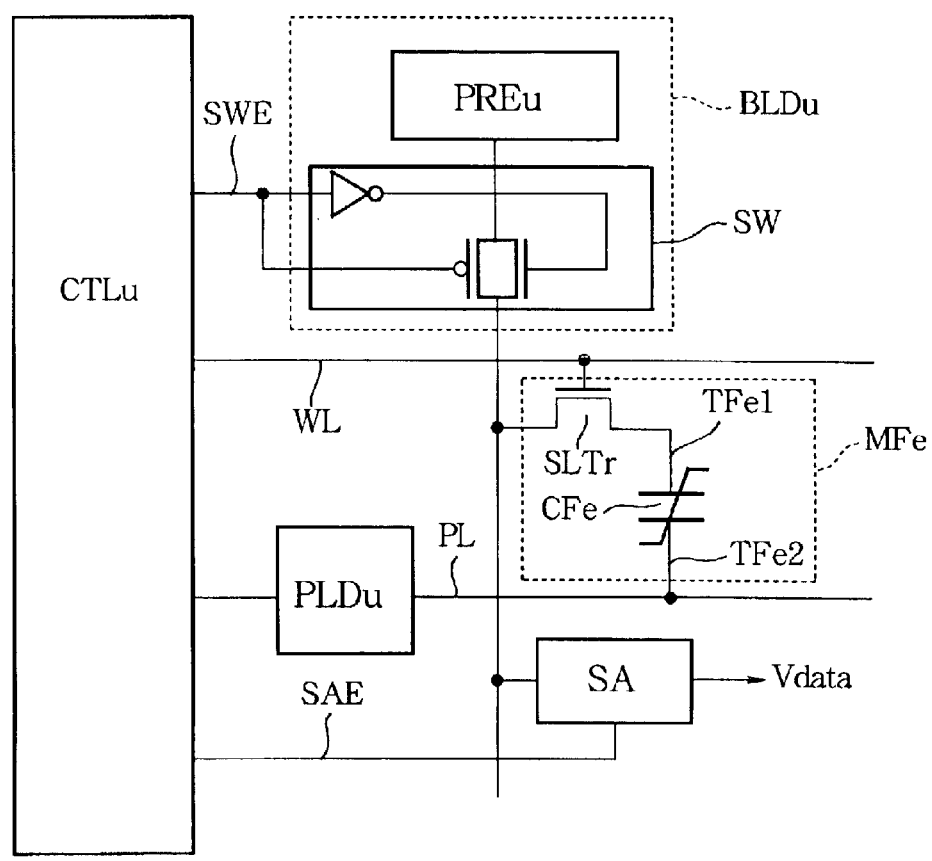
FIG. 6 is a circuit diagram illustrating a conventional ferroelectric memory.

Referring to FIG. 1, a ferroelectric memory in a first embodiment of the invention includes a ferroelectric memory cell MFe, a bit-line driver BLD, a plate-line driver PLD, a sense amplifier SA, and a control circuit CTL. The ferroelectric memory cell MFe and sense amplifier SA are identical to the corresponding elements in the conventional ferroelectric memory in FIG. 6, but the bit-line driver BLD, plate-line driver PLD, and control circuit CTL differ from the conventional bit-line driver BLDu, plate-line driver PLDu, and control circuit CTLu.

Ferroelectric Memory Cell MFe

The ferroelectric memory cell MFe is a memory cell of the 1T1C type, comprising a single selection transistor SLTr and a single ferroelectric capacitor CFe. The ferroelectric capacitor CFe has a first terminal TFe1 coupled through the selection transistor SLTr to a bit line BL, and a second terminal TFe2 connected to a plate line PL. The ferroelectric capacitor CFe stores '0' and '1' information or data as a (remnant) polarization state.

The selection transistor SLTr is an n-channel metal-oxide-semiconductor (NMOS) transistor having its gate electrode coupled to the word line WL, the level of which is controlled by the control circuit CTL. Thus the selection transistor SLTr turns on and off under control of the control circuit CTL, according to the level of the word line WL. When the word line WL is set to the high logic level, the selection transistor SLTr is turned on and couples the first terminal TFe1 of the ferroelectric capacitor CFe to the bit line BL; when the word line WL is set to the low logic level, the selection transistor SLTr is turned off, disconnecting the first terminal TFe1 from the bit line BL.

Bit-Line Driver BLD

The bit-line driver BLD includes a pre-charger PRE and a switch circuit SW. The switch circuit SW, which comprises a metal-oxide-semiconductor (MOS) transistor switch and an inverter, is connected through a switch control line SWE to the control circuit CTL. The switch circuit SW turns on and off under control of the control circuit CTL, according to the level of the switch control line SWE. When the switch control line SWE is set to the low logic level, the switch circuit SW is turned on and applies the output voltage of the pre-charger PRE to the bit line BL; when the switch control line SWE is set to the high logic level, the switch circuit SW is turned off, disconnecting the bit line BL from the output of the pre-charger PRE.

The pre-charger PRE, which is connected through the switch circuit SW to the bit line BL, is also controlled by the control circuit CTL. The pre-charger PRE can apply voltages denoted Vee (=0 V), Vref (a reference potential), and Vpre (a preliminary potential) to the bit line BL when the switch circuit SW is turned on, thereby setting the potential VBL of the bit line BL to Vee, Vref, or Vpre.

Plate-Line Driver PLD

The plate-line driver PLD, which is controlled by the control circuit CTL, can apply voltages denoted Vcc (the power supply potential), Vee, Vref, Vh, Vpre, and Vinv to the plate line PL, thereby setting the potential VPL of the plate line PL to Vcc, Vee, Vref, Vh, Vpre, or Vinv. The last four of these potentials will be described in more detail below.

Sense Amplifier SA

The sense amplifier SA is connected through a sense amplifier enable line SAE to the control circuit CTL. The sense amplifier SA is thus controlled by the control circuit CTL, operating according to the level of the sense amplifier enable line SAE. When the sense amplifier enable line SAE is set to the low logic level, the sense amplifier SA is disconnected from the bit line BL and is in the high-impedance state.

If the sense amplifier enable line SAE is set to the high logic level, the sense amplifier SA is connected to the bit line BL to sense the potential Vread produced on the bit line BL (the first terminal TFe1 of the ferroelectric capacitor CFe) by a reading operation, responsive to the data stored in the ferroelectric capacitor CFe, thereby determining whether the read data value is '0' or '1'.

If the data value is '0', the sense amplifier SA latches the bit line BL at 0 V, and outputs a read signal Vdata responsive to '0' information. If the data value is '1', the sense amplifier SA latches the bit line BL at Vcc, and outputs a read signal Vdata responsive to '1' information.

Control Circuit CTL

The control circuit CTL controls the operations of the bit-line driver BLD, the plate-line driver PLD, the selection transistor SLTr, and the sense amplifier SA, thereby controlling the storing and reading of data in the ferroelectric memory in FIG. 1.

In FIG. 1 only a single ferroelectric memory cell MFe is shown, so there is only a single word line WL, bit line BL, plate line PL, switch circuit SW, pre-charger PRE, and sense amplifier SA. An actual ferroelectric memory includes a plurality of ferroelectric memory cells MFe, and has a plurality of word lines WL, one or a plurality of bit lines BL and plate lines PL, and one or a plurality of switch circuits SW, pre-chargers PRE, and sense amplifiers SA.

In the reading operation in a first embodiment of the invention, described below, before the series of read voltages is applied across the terminals of the ferroelectric capacitor, and before the two terminals of the ferroelectric capacitor are placed at identical potentials and the bit line is left in an electrically floating state, a voltage is applied across the terminals of the ferroelectric capacitor to increase the polarization of the ferroelectric capacitor if the stored data value is '0'.

Figure 2:
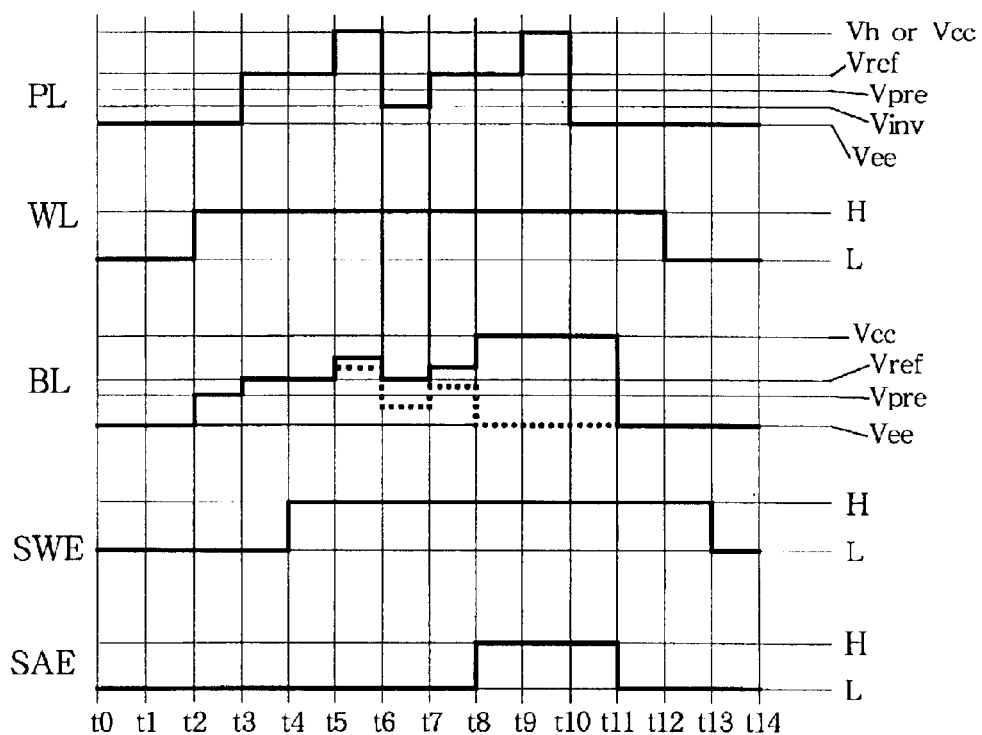
FIG. 2 is a timing diagram illustrating a reading operation in the first embodiment.
Figure 3A:
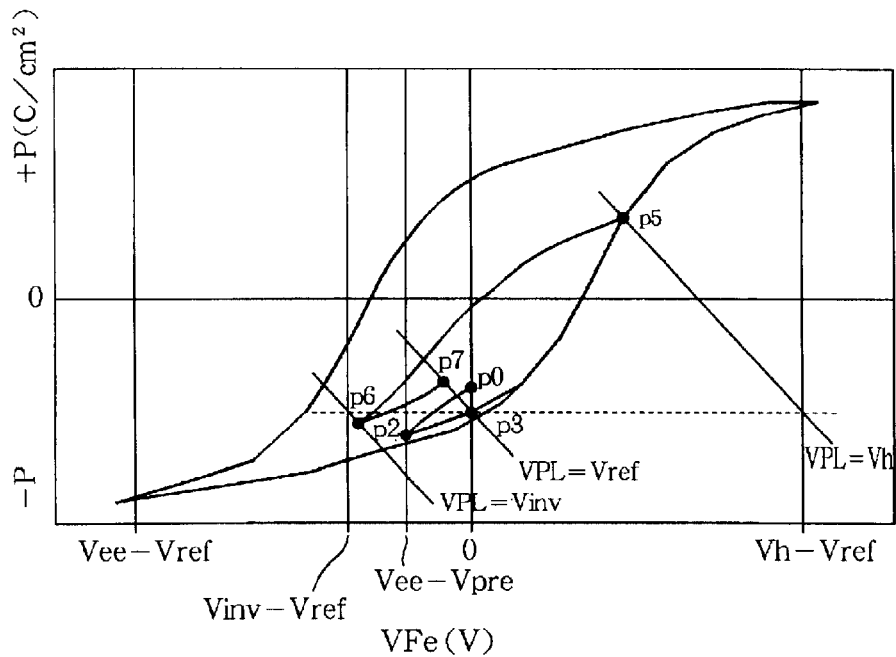
FIGS. 3A and 3B are graphs illustrating the polarization of the ferroelectric capacitor during the reading operation in the first embodiment.
Figure 3B:
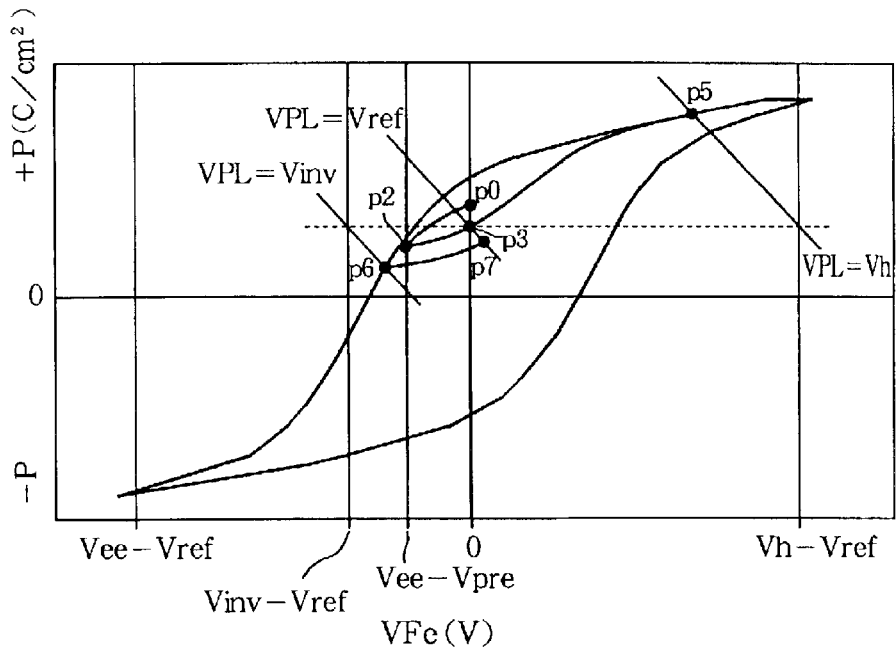

FIG. 2 is a timing diagram illustrating the reading operation in the first embodiment. FIG. 3A is a graph illustrating the polarization of the ferroelectric capacitor CFe during the reading operation in FIG. 2 when '0' information is stored; FIG. 3B is a graph illustrating the polarization of the ferroelectric capacitor CFe during the reading operation when '1' information is stored.

The symbol p0 in FIGS. 3A and 3B indicates the polarization at timings t0 and t1 in FIG. 2. The symbol p2 indicates the polarization at timing t2. The symbol b3 indicates the polarization at timings t3 and t4. The symbols p5, p6, and p7 respectively indicate the polarization at timings t5, t6, and t7. The horizontal axis in FIGS. 3A and 3B indicates the voltage VFe across the terminals of the ferroelectric capacitor CFe. The vertical axis indicates the amount of positive or negative polarization (+P or −P) of the ferroelectric capacitor CFe (the polarization charge) in coulombs per square centimeter.

The outer hysteresis curves in these drawings indicate the saturation polarization characteristic. The inner hysteresis curves, disposed within the saturation polarization curves, indicate transitions during the reading operation. It is assumed that while storing the '0' or '1' information, the ferroelectric capacitor CFe has lost some of its polarization, so that the reading operation starts (at timings t0–t1) from a point p0 located inside the saturation polarization hysteresis curves in FIGS. 3A and 3B.

A ferroelectric capacitor comprises a ferroelectric layer or layers made up of domains having a reversible electrical polarization. In the saturation polarization state all domains are polarized in the same direction. In a partially polarized state such as the state at point p0, the number of domains aligned in the same direction is less than in the saturation polarization state.

In the reading operation in FIG. 2, the bit line BL is placed in an electrically floating state, then the first terminal TFe1 of the ferroelectric capacitor CFe is coupled through the selection transistor SLTr to the bit line BL and the voltages Vh, Vinv, and Vref are applied sequentially to the plate line PL at timings t5, t6, and t7, the bit line BL acting as a capacitive load. The diagonal lines in FIGS. 3A and 3B are capacitive load lines for potentials of Vh, Vinv, and Vref on the plate line PL.

In FIG. 1, only a single selection transistor SLTr is connected to the bit line BL, but in an actual ferroelectric memory, a plurality of selection transistors (MOS transistors) are connected to a bit line. There is a diffusion capacitance between the source and drain diffusions of each selection transistor and the substrate; this capacitance operates as a capacitive component between the bit line and the substrate potential. These capacitive components constitute the capacitive load of the bit line.

The read voltages applied to the ferroelectric capacitor in a ferroelectric memory cell change the capacitance of the ferroelectric capacitor. The capacitance changes may take place on or within the saturation polarization hysteresis curve. In a simplified 1T1c ferroelectric memory cell, the ferroelectric capacitor, being coupled between the plate line and the bit line, is in series with the capacitive load between the bit line and the substrate potential. When the bit line is in the floating state (disconnected from the bit-line driver and sense amplifier), the bit-line potential is produced by capacitive voltage division of the plate-line potential by the ferroelectric capacitor and the capacitive load. Thus when the bit line is floating, the capacitive load lines in FIGS. 3A and 3B are defined by the values of the plate-line potential and the capacitive load.

The reading operation in the first embodiment, and the polarization changes in the ferroelectric capacitor CFe during the operation, will be described below with reference to FIGS. 1, 2, 3A, and 3B. The reading operation is controlled by the control circuit CTL. The writing operation in the first embodiment is carried out as in the prior art, so a description will be omitted.

Timing t0: Start of Reading

At timing t0 the switch control line SWE is at the low logic level, the switch circuit SW is turned on, and the pre-charger PRE applies Vee (=0 V) to the bit line BL. Vee is also applied to the plate line PL by the plate-line driver PLD. The word line WL is at the low logic level and the selection transistor SLTr is turned off, so the first terminal TFe1 of the ferroelectric capacitor CFe is disconnected from the bit line BL and is in an electrically floating state. The sense amplifier enable line SAE is at the low logic level and the sense amplifier SA is in the high-impedance state, electrically disconnected from the bit line BL. The symbol p0 indicates the polarization of the ferroelectric capacitor CFe at timings t0 and t1; the voltage VFe across the terminals of the ferroelectric capacitor CFe is substantially 0 V.

Timing t2: First Terminal TFe1 at Vpre

At timing t2, Vpre (Vinv$\leq$Vpre<Vref) is applied to the bit line BL by the pre-charger PRE and the word line WL is driven to the high logic level, thereby turning on the selection transistor SLTr. The first terminal TFe1 of the ferroelectric capacitor CFe is now coupled through the selection transistor SLTr to the bit line BL, so the potential of the first terminal TFe1 of the ferroelectric capacitor CFe is set to Vpre, creating a negative voltage Vee−Vpre=−Vpre across the terminals of the ferroelectric capacitor CFe. The polarization state shifts from point p0 to point p2. It is assumed that the potential drop in the selection transistor SLTr is negligible; this assumption is also made in the description below.

Applying Vpre to the bit line BL at timing t2 shifts the polarization of the ferroelectric capacitor CFe along a partial polarization hysteresis curve. The polarization of a ferroelectric capacitor CFe in which '0' information is stored is increased (moves toward the saturated polarization state at which the data will be rewritten, as shown in FIG. 3A); the polarization of a ferroelectric capacitor CFe in which '1' information is stored is reduced (moves farther away from the saturated polarization state, as shown in FIG. 3B).

At the next timing t3, the plate line PL and bit line BL are raised to Vref by the plate-line driver PLD and pre-charger PRE. Since the two terminals of the ferroelectric capacitor CFe at both at the Vref potential, the voltage VFe across the ferroelectric capacitor CFe is zero (VFe=0 V). Changing VFe from −Vpre back to 0 V shifts the polarization state from point p2 to a point p3 that differs from point p0: if the ferroelectric capacitor CFe is storing '0' information, as shown in FIG. 3A, the polarization is greater at point p3 than at point p0; if the ferroelectric capacitor CFe is storing '1' information, as shown in FIG. 3B, the polarization is less at point p3 than at point p0.

Timing t4: Bit Line BL in Floating State

At the next timing t4, the switch control line SWE is set to the high logic level and the switch circuit SW is turned off. This disconnects the pre-charger PRE from the bit line BL, thereby placing the bit line BL in an electrically floating state. The bit line BL remains in the floating state from this timing t4 to timing t8.

Timings t5–t7: Read Voltage Sequence

Next, while the bit line BL remains in the floating state, the plate line PL is driven to Vh (>Vref) at timing t5, Vinv (Vee<Vinv<Vref) at timing t6, and Vref (the same potential as at timing t4) at timing t7 by the plate-line driver PLD.

Setting the potential VPL of the plate line PL (the potential of the second terminal TFe2 of the ferroelectric capacitor CFe) to Vh at timing t5 creates a positive voltage across the terminals of the ferroelectric capacitor CFe. The polarization state shifts from point p3 to point p5, which is disposed at the intersection of the hysteresis characteristic with the capacitive load line for VPL=Vh. If '0' information is stored as in FIG. 3A, point p3 is disposed near the saturation polarization hysteresis curve on the −P side, so the locus of the state transition from point p3 to point p5 substantially follows the saturation polarization hysteresis curve on this side.

Setting the potential VPL of the plate line PL to Vinv at timing t6 creates a negative voltage across the terminals of the ferroelectric capacitor CFe. The polarization shifts from point p5 to point p6, which is disposed at the intersection of the hysteresis curve with the capacitive load line for VPL=Vinv.

Returning the potential VPL of the plate line PL to Vref at timing t7 creates a voltage VFe across the terminals of the ferroelectric capacitor CFe that may be either positive or negative, depending on the stored data. The polarization shifts from point p6 to point p7, which is disposed at the intersection of the hysteresis curve with the capacitive load line for VPL=Vref.

The application of this series of read voltages at timings t5–t7 produces a potential Vread on the bit line BL at timing t7. Vread differs depending on the polarization of the ferroelectric capacitor CFe. If the stored data value is '0', then Vread<Vref; if the stored data value is '1', then Vread>Vref.

Timing t8: Detect Read Data

At the next timing t8, the sense amplifier enable line SAE is set to the high logic level to activate the sense amplifier SA. The sense amplifier SA compares Vread with the reference potential Vref. If Vread<Vref the read data value is '0', a read signal Vdata responsive to '0' information is output, and the bit line BL is latched at 0 V. If Vread>Vref the read data value is '1', a read signal Vdata responsive to '1' information is output, and the bit line BL is latched at Vcc.

Timings t9–t10: Rewrite

While the bit line BL remains latched at 0 V or Vcc by the sense amplifier SA, Vcc is applied to the plate line PL at timing t9, and 0 V is applied at timing t10. The ferroelectric capacitor CFe is thereby restored to the saturation polarization state representing the data value held before the reading operation began.

Timing t11

At the next timing t11, the sense amplifier enable line SAE is set to 0 V to inactivate the sense amplifier SA. The sense amplifier SA sets the bit line BL to 0 V, then enters the high-impedance state, leaving the ferroelectric capacitor CFe at the 0-V point on the upper or lower saturation polarization hysteresis curve.

Timing t12

At the next timing t12, the word line WL is set to the low logic level to turn off the selection transistor SLTr. This disconnects the first terminal TFe1 of the ferroelectric capacitor CFe from the bit line BL.

Timing t13

At the next timing t13, the switch control line SWE is set to the low logic level to turn on the switch circuit SW, and 0 V is supplied to the bit line BL by the pre-charger PRE. This completes the reading of data in the above operations from timing t0 to timing t13.

Examples of settable ranges and desirable values of Vcc, Vee, Vref, Vh, Vpre, and Vinv in the first embodiment will be described below.

Vcc, Vee

Vcc is, for example, a positive power supply. Vee is, for example, a substrate potential (Vee=0 V).

Vh

The ferroelectric capacitor CFe is operated so that the potential VT1 of its first terminal TFe1 and the potential VT2 (=VPL) of its second terminal TFe2 stay within the ranges $Vee \leq VT1 \leq Vh$ and $Vee \leq VT2 \leq Vh$, or $Vee \leq VT1 \leq Vcc$ and $Vee \leq VT2 \leq Vcc$. The voltage Vh should be set so as to satisfy $Vee \leq VT1 \leq Vh$ and $Vee \leq VT2 \leq Vh$, and to obtain an adequate hysteresis loop. The desirable value of Vh may differ according to conditions such as the capacitive load of the bit line BL, but a value equal or nearly equal to Vcc is practical. Vh=Vcc, is appropriate, for example.

Vref

Vref is the potential applied to the two terminals of the ferroelectric capacitor CFe when they are set to identical potentials. At timing t7 in the reading operation, the potential VBL on the bit line BL must satisfy VBL<Vref to read '0' information, and VBL>Vref to read '1' information. Since the ferroelectric capacitor CFe operates in the ranges noted above (Vee≦VT1≦Vh and Vee≦VT2≦Vh, or Vee≦VT1≦Vcc and Vee≦VT2≦Vcc), an appropriate value for Vref is, for example, (Vh−Vee)/2 or (Vcc−Vee)/2.

Vinv

The value of Vinv should be set so that when the potential VPL of the plate line PL is changed from Vinv to Vref at timing t7 in FIG. 2, the polarization of the ferroelectric capacitor CFe follows a partial polarization hysteresis curve if '0' information is stored, and follows either a partial polarization hysteresis curve or the saturation polarization hysteresis curve on the −P side if '1' information is stored. Vinv must be less than Vref; otherwise (if Vinv≧Vref), the polarization of a ferroelectric capacitor CFe storing '1' information would be left on the saturation polarization hysteresis curve, on the +P side in FIG. 3B, at timing t7. Similarly, Vinv must be greater than Vee; otherwise (if Vinv=Vee), the polarization of a ferroelectric capacitor CFe storing '0' information would be left on the saturation polarization hysteresis curve on the −P side in FIG. 3A at timing t7. The value of Vinv should therefore be set in the following range.

$$\text{Vee} < \text{Vinv} < \text{Vref} \tag{1}$$

An appropriate value is, for example, Vinv=Vcc/4.

Vpre

If VFe1 represents the preliminary voltage placed across the terminals of the ferroelectric capacitor CFe at timing t2, when Vpre is applied to the bit line BL, then VFe1=Vee−Vpre. The purpose of the voltage excursion from 0 V to VFe1, then back to 0 V, is to increase the polarization representing '0' information. In FIG. 3A, the polarization is increased from point p0 to point p3. To obtain this increase, VFe1 must be less than zero. The polarization of a ferroelectric capacitor CFe storing '0' information would not be increased if VFe1≧0. Vpre must therefore be higher than Vee. If Vpre is too high, however, then the voltage across the terminals of the ferroelectric capacitor CFe at timing t2 may exceed the difference between Vinv and Vref:

$$|VFe(t2)| > |Vinv - Vref|$$

A voltage excursion of this magnitude would reverse the relationship between point p3 and the point p7 in FIG. 3B, making the polarization at point p7 exceed the polarization at point p3, thus preventing '1' information from being read correctly. VFe1 must therefore be within the following range.

$$|VFe1| \leq |Vinv - Vref|$$

The following condition must therefore be satisfied.

$$|Vee - Vpre| \leq |Vinv - Vref| \tag{2}$$

The value of Vpre should therefore be set in the following range.

$$\text{Vee} < \text{Vpre} \leq \text{Vref} - \text{Vinv} + \text{Vee} \tag{3}$$

An appropriate value is, for example, (Vcc−Vee)/8, although other values may be used, including values higher than Vinv, as in FIG. 2.

If the capacitive load line (for VPL=Vinv) intersecting point p6 in FIG. 3B is taken into account, the range of Vpre in the above equation (2) is somewhat too wide. If the symbols P3 and P6 indicate the polarization charge at point p3 and point p6, respectively, the voltage drop due to the load capacitance CBL of the bit line BL can be specified as (P3−P6)/CBL, so to avoid reversing the polarization relationship of points p3 and p7, the following condition should be satisfied:

$$|Vee - Vpre| \leq |Vinv - Vref + (P3-P6)/CBL| \tag{2a}$$

If the capacitive load CBL is taken into account, the value of Vpre should therefore be set in the following range.

$$\text{Vee} < \text{Vpre} \leq \text{Vref} - \text{Vinv} - (P3-P6)/CBL + \text{Vee} \tag{3a}$$

If VFeR1 (the first read voltage) represents the voltage VFe across the terminals of the ferroelectric capacitor CFe at timing t5, when Vh is applied to the plate line PL, and if VFeR2 (the second read voltage) represents the voltage VFe across the terminals of the ferroelectric capacitor CFe at timing t6, when Vinv is applied to the plate line PL, then VFeR1 is greater than zero and VFeR2 is less than zero. The absolute value of the preliminary voltage VFe1 is less then the absolute value of the second read voltage VFeR2:

$$0 < |VFe1| \leq |VFeR2|$$

VFe1 is less than zero, as noted above. If VFeR1 is less than zero and VFeR2 is greater than zero, however, then VFe1 is greater than zero. The preliminary voltage VFe1 therefore has a polarity opposite to the polarity of the first read voltage VFeR1 and identical to the polarity of the second read voltage VFeR2.

Figure 7:
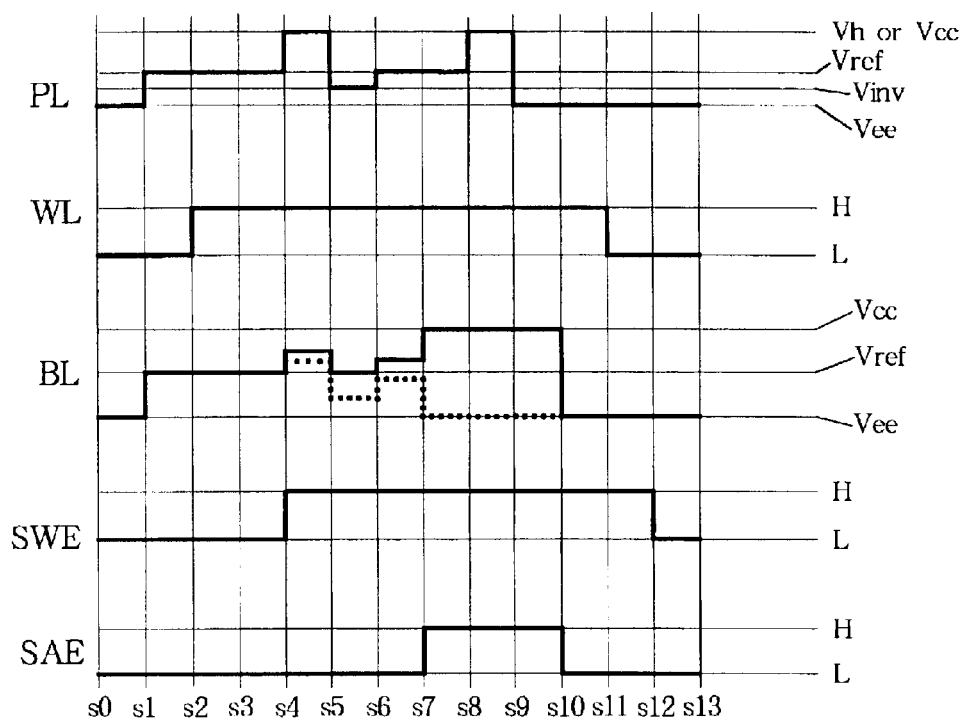
FIG. 7 is a timing diagram illustrating a conventional reading operation.

The key to widening the reading margin of a ferroelectric memory is to make use of the saturation polarization hysteresis loop in the reading operation. In a reading operation in which data are read from a point on a partial polarization hysteresis loop, as in the prior art in FIG. 7 and in the first embodiment, in order to increase the difference between Vref and the potential Vread produced on the bit line BL (to widen the reading margin), it is important to use the saturation polarization hysteresis loop as well as the partial polarization hysteresis loop, by shifting the polarization state of the ferroelectric capacitor CFe along the saturation polarization hysteresis curve (or through a region near the saturation hysteresis curve) before finally shifting it along the partial polarization hysteresis curve.

In the prior art described above, if the ferroelectric capacitor CFe is storing '0' information in a state of reduced polarization, the polarization of the ferroelectric capacitor CFe does not shift along the saturation polarization hysteresis curve (or along a path near the saturation hysteresis curve) at any time, so the data reading operation uses only the partial polarization hysteresis loop. As a result, the reading margin for '0' information is narrowed and the data cannot be read accurately.

Figure 8A:
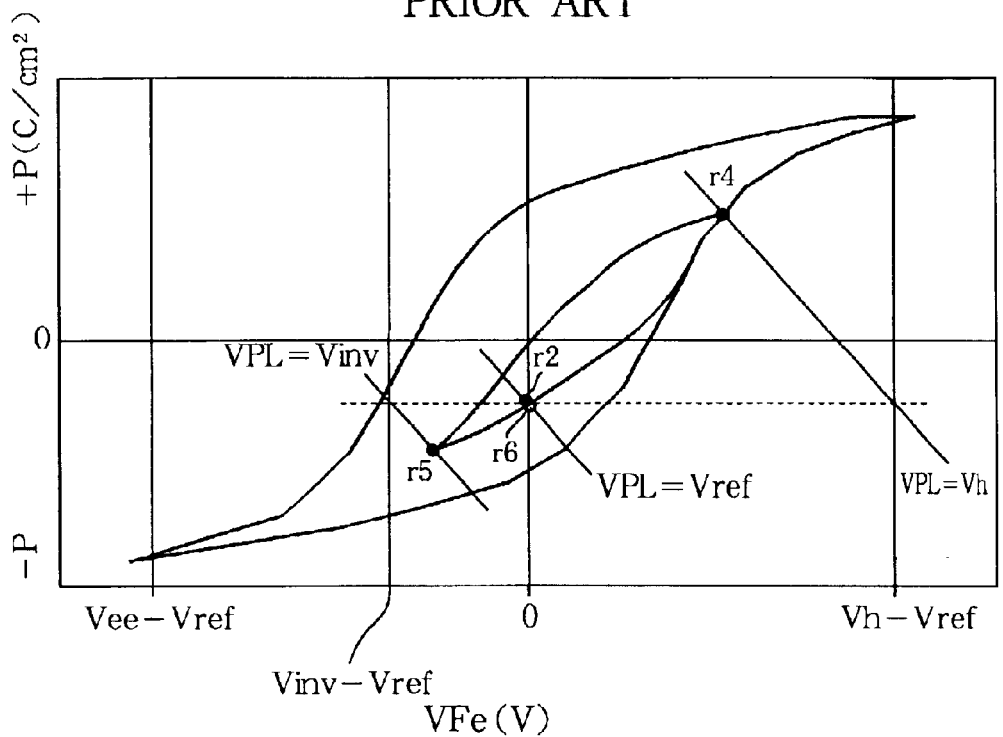
FIGS. 8A and 8B are graphs illustrating the polarization of the ferroelectric capacitor during the conventional reading operation.
Figure 8B:
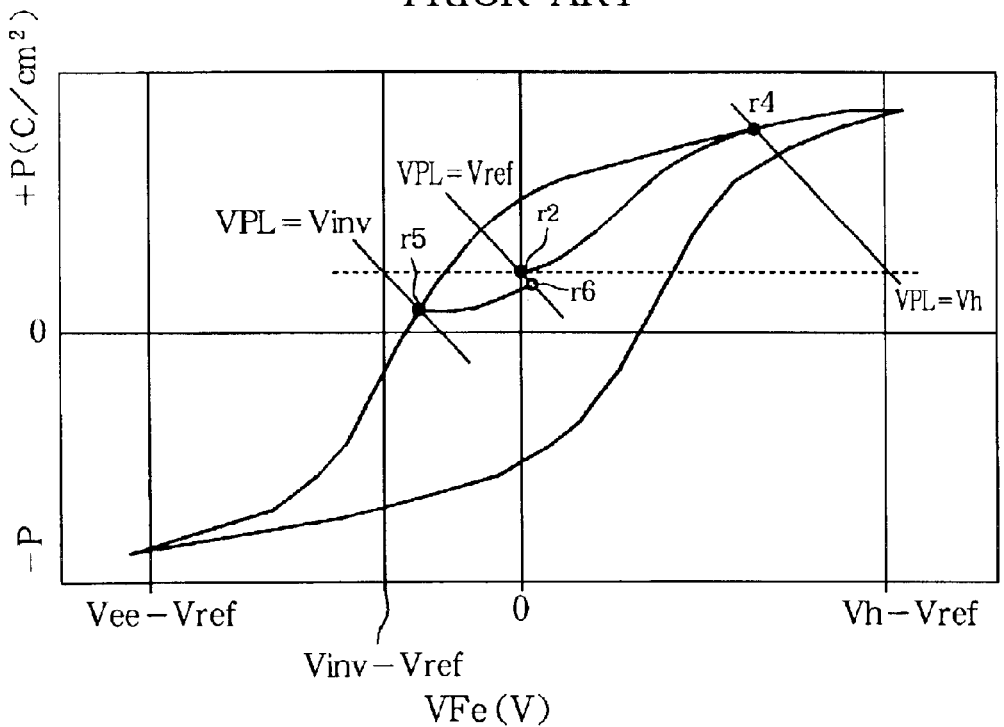

More specifically, the locus of the state transition from point r2 to point r4 in FIG. 8A does not move along the saturation polarization hysteresis curve but follows a partial polarization hysteresis curve, with the result that point r6 may be at the same location as point r2. The potential Vread produced on the bit line BL at timing s6 may therefore be substantially identical to Vref, or even higher than Vref, in which case the data cannot be read correctly.

In the first embodiment, application of the preliminary voltage VFe1 increases the polarization of the ferroelectric capacitor CFe if the stored information is '0', so when the series of read voltages is applied, even if the ferroelectric capacitor CFe was originally in a reduced polarization state, its polarization can follow the saturation polarization hysteresis curve (or a path near the saturation hysteresis curve) before shifting onto the partial polarization hysteresis curve, thereby widening the reading margin.

More specifically, in FIG. 3A the ferroelectric capacitor CFe stores '0' information in a reduced polarization state at point p0. Application of the preliminary voltage at timing t2 in FIG. 2 shifts the polarization in FIG. 3A toward the saturated state (the state in which the data will be rewritten), thereby bringing the polarization (point p2) of the ferroelectric capacitor CFe closer to the saturation polarization hysteresis curve. When the applied voltage returns to 0 V at time t3, the polarization state moves even closer to the saturation curve (point p3). The locus of the state transition from point p3 to p5 in FIG. 3A substantially follows the saturation polarization hysteresis curve. As a result, even though the ferroelectric capacitor CFe was originally in a reduced polarization state, point p7 is well above point p3 in FIG. 3A, and a potential Vread lower than Vref is produced on the bit line BL at timing t7. Compared with the prior art, the difference between the Vread potential and Vref is increased, and '0' information can be read accurately.

If the stored information is '1' as in FIG. 3B, application of the comparatively high potential Vh to the plate line PL at timing t5 shifts the polarization of the ferroelectric capacitor CFe close to the saturated state in which the data will be rewritten, so when Vinv is applied to the plate line PL at timing t6, the locus of the state transition from point p5 to p6 follows the saturation polarization hysteresis curve, regardless of the locations of points p0 and p3. This enables a wide reading margin to be secured for '1' information as well.

Application of a preliminary voltage VFe1 that increases the polarization of the ferroelectric capacitor CFe if the stored information is '0', before application of the series of read voltages VFeR1 and VFeR2, is therefore an effective way to widen the reading margin. Regardless of the locations of points p0 and p3, the potential VBL=Vread which is produced on the bit line BL when the potential VPL of the plate line PL is returned to Vref at timing t7 is lower than Vref if the information stored in the ferroelectric capacitor CFe is '0' (as shown in FIG. 3A), and is higher than Vref if the information stored in the ferroelectric capacitor CFe is '1' (as shown in FIG. 3B). Therefore, when the sense amplifier SA compares Vread with the reference potential Vref at timing t7, it can accurately determine whether the read data value is '0' or '1'.

In the first embodiment of the invention, after the preliminary voltage VFe1 (preliminary potential Vpre) has been applied to compensate for reduced polarization, the two terminals of the ferroelectric capacitor CFe are placed identically at the Vref potential, producing a potential on the bit line BL according to the initial polarization state; then the bit line BL is placed in an electrically floating state. Application of the preliminary voltage VFe1 before the bit line BL is left in the electrically floating state prevents the load capacitance of the bit line BL from being affected by unwanted noise when the preliminary voltage VFe1 is applied. Since the preliminary voltage VFe1 is applied before the potential due to the initial polarization state is read onto on the bit line BL, however, it is not possible to separate the compensation for reduced polarization (the operation at timing t2) from the reading of the initial polarization state (the operation at timing t3), so Vpre must be set within the range given by equation (3) or (3a) above.

In the first embodiment, as described above, application of the preliminary voltage VFe1 increases the polarization of the ferroelectric capacitor CFe if the stored information is '0', so when the series of read voltages VFeR1 and VFeR2 is applied, even if the ferroelectric capacitor CFe was originally in a reduced polarization state, a wide reading margin can be obtained and a stable reading operation can be performed. This effect is particularly apparent in a reading operation that uses a partial polarization hysteresis loop to detect the read data.

The application of the preliminary voltage VFe1 before the bit line BL is left in an electrically floating state prevents unwanted effects such as noise effects on the load capacitance of the bit line BL, thereby enabling the reading operation to be carried out in a stable manner.

In the reading operation in a second embodiment of the invention, described below, the operations before the series of read voltages is applied across the terminals of the ferroelectric capacitor are carried out in a different order: first, the two terminals of the ferroelectric capacitor are placed at identical potentials; next, the bit line is floated; then a voltage is applied across the terminals of the ferroelectric capacitor to increase the polarization of the ferroelectric capacitor if the stored data value is '0'.

Figure 4:
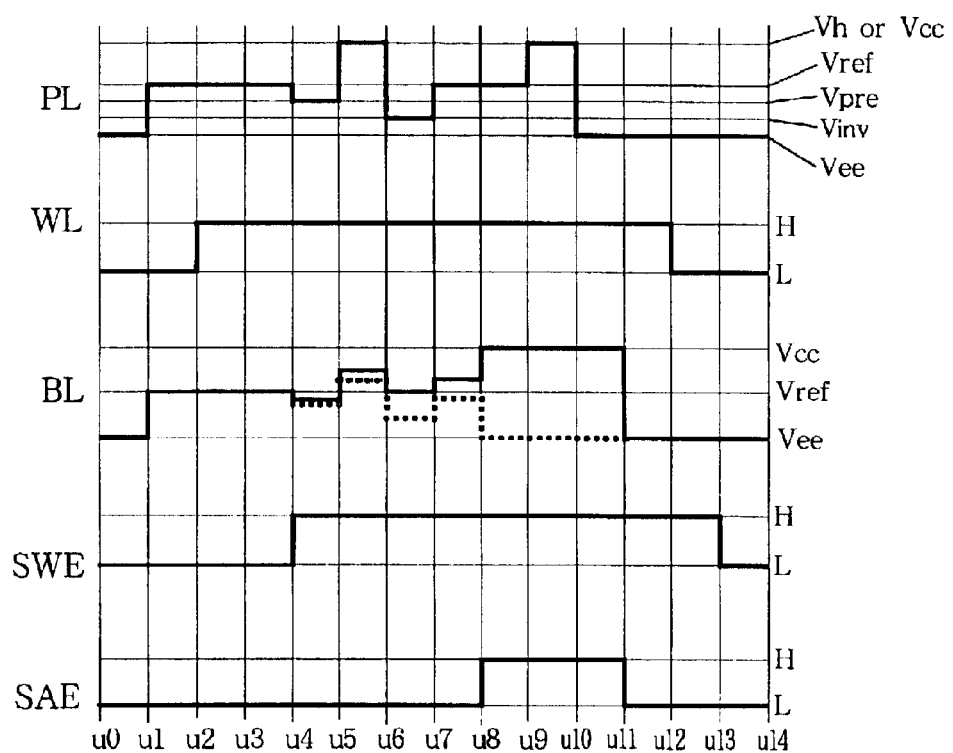
FIG. 4 is a timing diagram illustrating a reading operation in a second embodiment of the invention.
Figure 5A:
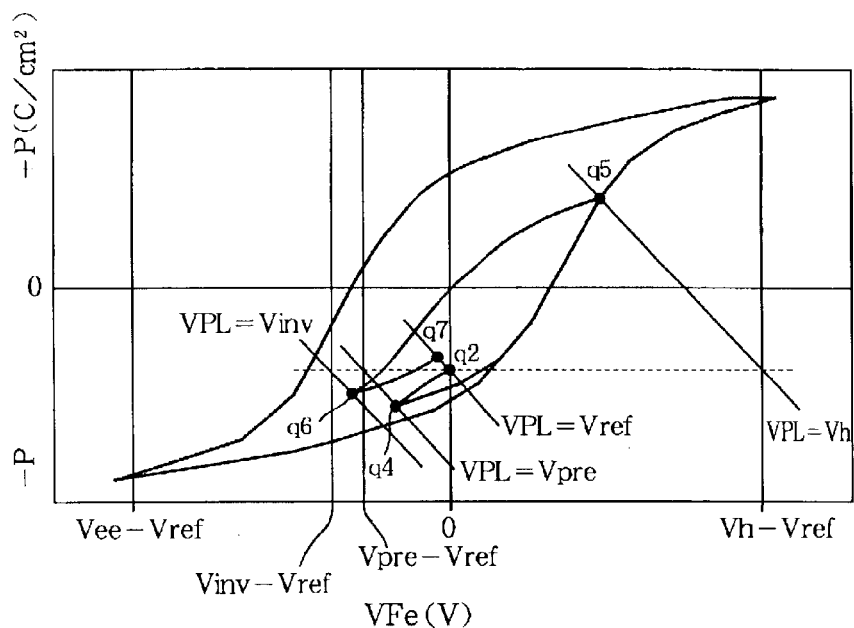
FIGS. 5A and 5B are graphs illustrating the polarization of the ferroelectric capacitor during the reading operation in the second embodiment.
Figure 5B:
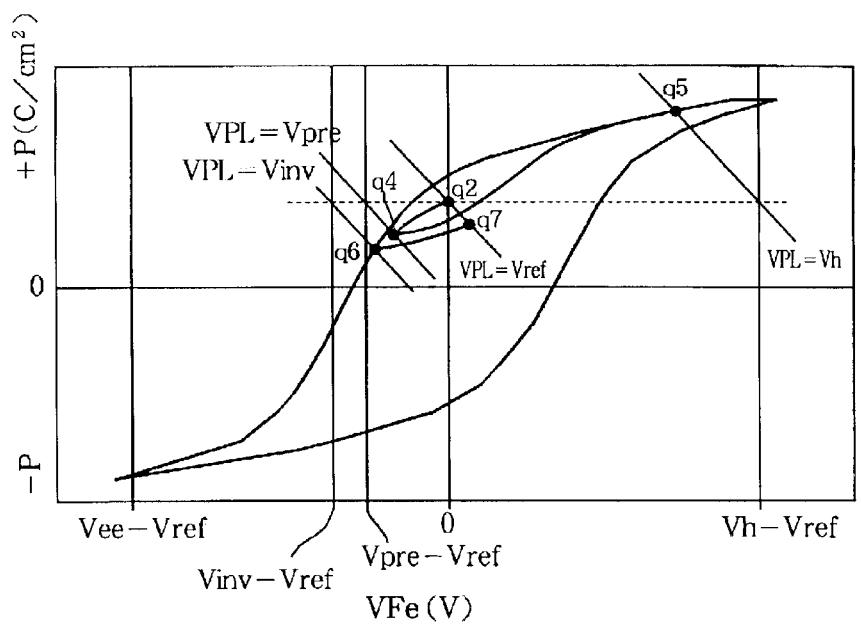

FIG. 4 is a timing diagram illustrating the reading operation in the second embodiment. FIG. 5A is a graph illustrating the polarization of the ferroelectric capacitor CFe during the reading operation in FIG. 4 when '0' information is stored; FIG. 5B is a graph illustrating the polarization of the ferroelectric capacitor CFe during the reading operation when '1' information is stored.

The symbol q2 in FIGS. 5A and 5B indicates the polarization at timings u2 and u3 in FIG. 4. The symbols q4, q5, q6, and q7 respectively indicate the polarization at timings u4, u5, u6, and u7. The horizontal axis in FIGS. 5A and 5B indicates the voltage VFe across the terminals of the ferroelectric capacitor CFe. The vertical axis indicates the amount of positive or negative polarization (+P or −P) of the ferroelectric capacitor CFe (the polarization charge in coulombs per square centimeter).

The outer hysteresis curves in these drawings indicate the saturation polarization characteristic and the inner hysteresis curves indicate partial polarization characteristics. As in the first embodiment, the ferroelectric capacitor CFe may lose some of its polarization over time, so that the reading operation starts from a partly polarized state instead of the saturated state, in which case point q2 (u2–u3) is located inside the saturation polarization hysteresis curves, as shown in FIGS. 5A and 5B.

In the reading operation in FIG. 4, after the first terminal TFe1 of the ferroelectric capacitor CFe has been coupled through the selection transistor SLTr to the bit line BL and the bit line BL has been placed in an electrically floating state, the voltages Vpre, Vh, Vinv, and Vref are applied sequentially to the plate line PL at timings u4, u5, u6, and u7, the bit line BL acting as a capacitive load. The diagonal lines in FIGS. 5A and 5B are capacitive load lines for potentials of Vpre, Vh, Vinv, and Vref on the plate line PL.

The reading operation in the second embodiment, and the polarization changes in the ferroelectric capacitor CFe during the operation, will be described below with reference to FIGS. 1, 4, 5A, and 5B. The reading operation is controlled by the control circuit CTL. The writing operation in the second embodiment is carried out as in the prior art, so a description will be omitted.

Timing u0: Start of Reading

At timing u0, 0 V is applied to the plate line PL by the plate-line driver PLD. The switch control line SWE is at the low logic level and the switch circuit SW is turned on, so 0 V is applied to the bit line BL by the pre-charger PRE. The word line WL is at the low logic level and the selection transistor SLTr is turned off, so the first terminal TFe1 of the ferroelectric capacitor CFe is disconnected from the bit line BL and is in an electrically floating state. The sense amplifier enable line SAE is at the low logic level and the sense amplifier SA is in the high-impedance state, electrically disconnected from the bit line BL.

Timing u1–u2: Both Terminals at Vref

At timing u1, Vref is applied to the plate line PL and bit line BL by the plate-line driver PLD and pre-charger PRE, and at timing u2, the word line WL is driven to the high logic level, thereby turning on the selection transistor SLTr. The first terminal TFe1 of the ferroelectric capacitor CFe is now coupled through the selection transistor SLTr to the bit line BL, so the two terminals of the ferroelectric capacitor CFe are placed identically at the Vref potential. The symbol q2 indicates the polarization of the ferroelectric capacitor CFe at timings u2 and u3. It is assumed that the voltage drop in the selection transistor SLTr is negligible; this assumption is also made in the description below.

Timing u3: Bit Line BL in Floating State

At the next timing u3, the switch control line SWE is set to the high logic level and the switch circuit SW is turned off. This disconnects the pre-charger PRE from the bit line BL, thereby placing the bit line BL in an electrically floating state. The bit line BL remains in the floating state from this timing u3 to timing u13.

Timing u4: Second Terminal TFe2 at Vpre

Next, while the bit line BL remains floating, at timing u4, the plate line PL is driven to Vpre (<Vref) by the plate-line driver PLD. Driving the plate line potential VPL (the potential of the second terminal TFe2 of the ferroelectric capacitor CFe) to Vpre creates a negative voltage across the terminals of the ferroelectric capacitor CFe. The polarization state shifts from point q2 to point q4, which is disposed at the intersection of the hysteresis characteristic with the capacitive load line for VPL=Vpre.

Applying Vpre to the plate line PL at timing u4, as described above, shifts the polarization of the ferroelectric capacitor CFe along a partial polarization hysteresis curve. The polarization of a ferroelectric capacitor CFe in which '0' information is stored is increased (moves toward the saturated polarization state at which the data will be rewritten, as shown in FIG. 5A); the polarization of a ferroelectric capacitor CFe in which '1' information is stored is reduced (moves farther away from the saturated polarization state, as shown in FIG. 5B).

Timings u5–u7

Next, while the bit line BL remains in the electrically floating state, the plate line PL is driven to Vh (>Vref) at timing u5, Vinv (<Vref) at timing u6, and Vref (the same potential as at timing u2) at timing u7 by the plate-line driver PLD.

Setting the potential VPL of the plate line PL (the potential of the second terminal TFe2 of the ferroelectric capacitor CFe) to Vh at timing u5 creates a positive voltage across the terminals of the ferroelectric capacitor CFe. The polarization state shifts from point q4 to point q5, which is disposed at the intersection of the hysteresis characteristic with the capacitive load line for VPL=Vh. If '0' information is stored as in FIG. 5A, point q4 is disposed near the saturation polarization hysteresis curve on the −P side, so the locus of the state transition from point q4 to point q5 does not pass through point q2 but follows the saturation polarization hysteresis curve on the −P side.

Setting the potential VPL of the plate line PL to Vinv at timing u6 creates a negative voltage across the terminals of the ferroelectric capacitor CFe. The polarization shifts from point q5 to point q6, which is disposed at the intersection of the hysteresis characteristic with the capacitive load line for VPL=Vinv.

Returning the potential VPL of the plate line PL to Vref at timing u7 creates a voltage VFe across the terminals of the ferroelectric capacitor CFe that may be either positive or negative according to the stored data. The polarization shifts from point q6 to point q7, which is disposed at the intersection of the hysteresis characteristic with the capacitive load line for VPL=Vref.

The application of this series of read voltages at timings u5–u7 produces a potential Vread on the bit line BL at timing u7. Vread differs depending on the polarization of the ferroelectric capacitor CFe. If the stored data value is '0', then Vread<Vref; if the stored data value is '1', then Vread>Vref.

The operations from timing u8 to timing u13 are carried out as in the first embodiment, so a description will be omitted. This completes the reading of data in the above operations from timing u0 to timing u13.

An example of a settable range and desirable value of Vpre in the second embodiment will be given below. Examples of settable ranges and desirable values of Vcc, Vee, Vh, Vref, and Vinv are as described above in the first embodiment.

Vpre

If VFe1 (the preliminary voltage) represents the voltage across the terminals of the ferroelectric capacitor CFe at timing u4, when Vpre is applied to the plate line PL, then as in the first embodiment, the application of this preliminary voltage VFe1 increases the polarization of the ferroelectric capacitor CFe if the stored information is '0', the increase being from point q2 to point q4 in FIG. 5A. To obtain this increase, however, it is necessary for the preliminary voltage Vref1 to be negative, that is, for Vpre to be lower than Vref; no increase is obtained when the stored information is '0' if Vpre−Vref≧0 and VFe1≧0.

In the first embodiment, Vpre had to satisfy a further condition in relation to Vinv, but this constraint does not apply in the second embodiment. Vpre may be set either so that $|Vpre-Vref| \leq |Vinv-Vref|$ or so that $|Vpre-Vref| > |Vinv-Vref|$ The preferred range of Vpre is therefore given by the following inequality.

$Vee-Vref < Vpre-Vref < 0$

That is, the value of Vpre may be set in the following range.

$Vee < Vpre < Vref$ \hfill (4)

An appropriate value of Vpre in the second embodiment is, for example, 3(Vcc−Vee)/8. It is also possible to set the Vpre potential equal to Vee (=0 V).

If VFeR1 (the first read voltage) represents the voltage VFe across the terminals of the ferroelectric capacitor CFe at timing u5, when Vh is applied to the plate line PL, and if VFeR2 (the second read voltage) represents the voltage VFe across the terminals of the ferroelectric capacitor CFe at timing u6, when Vinv is applied to the plate line PL, then VFeR1 is greater than zero and VFeR2 is less than zero. VFe1 is less than zero. If VFeR1 is less than zero and VFeR2 is greater than zero, however, then VFe1 is greater than zero. Therefore, in the second embodiment as well as in the first embodiment described above, the preliminary voltage VFe1 has a polarity opposite to the polarity of the first read voltage VFeR1 and identical to the polarity of the second read voltage VFeR2. The second embodiment, however, differs from the first embodiment in that VFe1 need not be set so that the absolute value of the preliminary voltage VFe1 is less than the absolute value of the second read voltage VFeR2. Thus the following constraint does not apply in the second embodiment:

$$0<|VFe1|\leq|VFeR2|$$

In the second embodiment, application of the preliminary voltage VFe1 increases the polarization of the ferroelectric capacitor CFe if the stored information is '0', so when the series of read voltages is applied, even if the ferroelectric capacitor CFe was originally in a reduced polarization state, its polarization can follow the saturation polarization hysteresis curve (or a path near the saturation hysteresis curve) before shifting onto the partial polarization hysteresis curve, thereby widening the reading margin.

More specifically, in FIG. 5A the ferroelectric capacitor CFe stores '0' information in a reduced polarization state at point q2. Application of the preliminary voltage at timing u4 in FIG. 4 shifts the polarization state q4 in FIG. 5A toward the saturated polarization state in which the data will be rewritten, thereby increasing the polarization of the ferroelectric capacitor CFe. The locus of the state transition from point q4 to q5 in FIG. 5A then follows the saturation polarization hysteresis curve (or a path that stays close to the saturation hysteresis curve). As a result, even though the ferroelectric capacitor CFe was originally in a reduced polarization state, point q7 is not at the same location as point q2 in FIG. 5A; a potential Vread lower than Vref is produced on the bit line BL at timing u7; the difference between this Vread potential and Vref is increased, as compared with the prior art; and the '0' information can be read accurately.

If the stored information is '1' as in FIG. 5B, application of the comparatively high potential Vh to the plate line PL at timing u5 shifts the polarization of the ferroelectric capacitor CFe close to the state in which the data will be rewritten, so when Vinv is applied to the plate line PL at timing u6, the locus of the state transition from point q5 to q6 follows the saturation polarization hysteresis curve, regardless of the location of point q2. This enables a wide reading margin to be secured for '1' information as well.

Application of a preliminary voltage VFe1 that increases the polarization of the ferroelectric capacitor CFe if the stored information is '0', before application of the series of read voltages VFeR1 and VFeR2, is again an effective way to widen the reading margin. Regardless of the location of point q2, the potential VBL=Vread which is produced on the bit line BL when the potential VPL of the plate line PL is returned to Vref at timing u7 is lower than Vref if the information stored in the ferroelectric capacitor CFe is '0' (as shown in FIG. 5A), and is higher than Vref if the information stored in the ferroelectric capacitor CFe is '1' (as shown in FIG. 5B). Therefore, when the sense amplifier SA compares Vread with the reference potential Vref at timing u7, it can accurately determine whether the read data value is '0' or '1'.

In the second embodiment of the invention, before the preliminary voltage VFe1 (Vpre) is applied to compensate for reduced polarization, the two terminals of the ferroelectric capacitor CFe have been placed identically at the Vref potential, producing a potential on the bit line BL according to the initial polarization state; then the bit line BL has been placed in the floating state.

More specifically, after the polarization state is placed at point q2, producing a potential on the bit line BL according to the initial polarization state in the operation at timing u2, the polarization of the ferroelectric capacitor CFe storing '0' information at point q2 in FIG. 5A is shifted to point q4, toward the saturated polarization state (in which the data will be rewritten), thereby increasing the polarization of the ferroelectric capacitor CFe at timing u4. Since the preliminary voltage VFe1 is applied after the potential due to the initial polarization state has been read onto on the bit line BL, it is possible to separate the compensation for reduced polarization (the operation at timing u4) from the reading of the initial polarization state (the operation at timing u2), so the settable range of Vpre is widened, leading to simplified control of the data reading operation.

In the second embodiment, as described above, application of the preliminary voltage VFe1 increases the polarization of the ferroelectric capacitor CFe if the stored information is '0', so when the series of read voltages VFeR1 and VFeR2 is applied, even if the ferroelectric capacitor CFe was originally in a reduced polarization state, a wide reading margin can be obtained and reading performance can be stabilized.

The application of the preliminary voltage VFe1 after a potential is produced on the bit line BL according to the initial polarization state allows Vpre to be set within a wider range than in the first embodiment, so that a wide reading margin to be obtained more easily.

As described above, the invented method and circuit employs a series of read voltages that provides a wider margin for reading '1' information than for reading '0' information. By increasing the polarization of the ferroelectric capacitor CFe if the stored information is a '0', application of the novel preliminary voltage increases the margin for reading a '0', thereby stabilizing the overall reading performance.

The invented method and circuit has been described as being used in a 1T1C ferroelectric memory cell, but it is also useful in other types of ferroelectric memory cells, such as a 1T2C ferroelectric memory cell (comprising a single transistor and two ferroelectric capacitors).

The reading methods in which the present invention can be applied effectively are not limited to the series of read voltages used in the prior art described above.

Those skilled in the art will recognize that further variations of the embodiments described above are possible within the scope of the appended claims.

What is claimed is:

1. A method of reading data stored in a ferroelectric capacitor in a ferroelectric memory cell, the ferroelectric capacitor having a first terminal and a second terminal, the method comprising:

applying a preliminary voltage to the ferroelectric capacitor, the preliminary voltage increasing a polarization of the ferroelectric capacitor if a certain data value is stored in the ferroelectric capacitor; then placing the first terminal and the second terminal of the ferroelectric capacitor identically at a reference potential after applying the preliminary voltage; and applying a series of read voltages to the ferroelectric capacitor while leaving the first terminal in an electrically floating state, the series of read voltages producing a potential responsive to the data stored in the ferroelectric capacitor at the first terminal (TFe1) of the ferroelectric capacitor.

2. The method of claim 1, wherein applying the series of read voltages further comprises:

applying a first read voltage having a polarity opposite to the preliminary voltage; then applying a second read voltage having a polarity opposite to the first read voltage; then placing the second terminal of the ferroelectric capacitor at the reference potential.

3. The method of claim 2, wherein the second read voltage has an absolute value equal to or greater than an absolute value of the preliminary voltage.

4. The method of claim 2, further comprising comparing the reference potential with the potential produced at the first terminal of the ferroelectric capacitor by application of the series of read voltages.

5. A method of reading data stored in a ferroelectric capacitor in a ferroelectric memory cell, the ferroelectric capacitor having a first terminal and a second terminal, the method comprising:

placing the first terminal and the second terminal of the ferroelectric capacitor identically at a reference potential;

applying a preliminary potential to the ferroelectric capacitor while leaving the first terminal in an electrically floating state, the preliminary potential increasing a polarization of the ferroelectric capacitor if a certain data value is stored in the ferroelectric capacitor; then applying a series of read voltages to the ferroelectric capacitor while still leaving the first terminal in an electrically floating state+, the series of read voltages producing a potential responsive to the data stored in the ferroelectric capacitor at the first terminal of the ferroelectric capacitor.

6. The method of claim 5, wherein applying the series of read voltages further comprises:

applying a first read voltage having a polarity opposite to the preliminary voltage; then applying a second read voltage having a polarity opposite to the first read voltage; then placing the second terminal of the ferroelectric capacitor at the reference potential.

7. The method of claim 6, further comprising comparing the reference potential with the potential produced at the first terminal of the ferroelectric capacitor by application of the series of read voltages.

8. A method of reading data stored in a ferroelectric capacitor in a ferroelectric memory cell, the ferroelectric capacitor having a first terminal and a second terminal, the method comprising:

applying a signal to a word line to select the ferroelectric memory cell;

applying a preliminary voltage to the ferroelectric capacitor, the preliminary voltage increasing a polarization of the ferroelectric capacitor if a certain data value is stored in the ferroelectric capacitor; then applying a series of read voltages to the ferroelectric capacitor, the series of read voltages producing a potential responsive to the data stored in the ferroelectric capacitor at the first terminal of the ferroelectric capacitor.

9. A circuit for reading data stored in a ferroelectric capacitor in a ferroelectric memory cell, the ferroelectric capacitor having a first terminal and a second terminal, the circuit comprising:

a first driver for driving said first terminal to a preliminary potential, thereby increasing a polarization of the ferroelectric capacitor if a certain data value is stored in the ferroelectric capacitor, and driving said first terminal to a reference potential, then placing said first terminal in an electrically floating state;

a second driver for driving said second terminal to a series of read potentials;

a sensing unit for sensing said data according to a potential of said first terminal; and a control unit for selecting the ferroelectric memory cell and controlling the first driver, the second driver, and the sensing unit, thereby causing the series of read potentials to be applied after said first terminal has been placed in the electrically floating state, and causing the sensing unit to sense said data after the series of read potentials has been applied.

10. The circuit of claim 9, wherein the second driver drives said second terminal to the reference potential while the first driver drives said first terminal to the reference potential.

11. The circuit of claim 10, wherein the series of read potentials includes a first read potential, a second read potential, and the reference potential, the reference potential being intermediate between the first read potential and the second read potential.

12. The circuit of claim 11, wherein the reference potential is intermediate between the first read potential and the preliminary potential.

13. The circuit of claim 11, wherein the sensing unit compares the reference potential with the potential of said first terminal.

14. A circuit for reading data stored in a ferroelectric capacitor in a ferroelectric memory cell, the ferroelectric capacitor having a first terminal and a second terminal, the circuit comprising:

a first driver for driving said first terminal to a reference potential, then placing said first terminal in an electrically floating state;

a second driver for driving said second terminal to a preliminary potential, thereby increasing a polarization of the ferroelectric capacitor if a certain data value is stored in the ferroelectric capacitor, then driving said second terminal to a series of read potentials;

a sensing unit for sensing said data according to a potential of said first terminal; and a control unit for selecting the ferroelectric memory cell and controlling the first driver, the second driver, and the sensing unit, thereby causing the preliminary potential to be applied after said first terminal has been placed in the electrically floating state, and causing the sensing unit to sense said data after the series of read potentials has been applied.

15. The circuit of claim 14, wherein the second driver drives said second terminal to the reference potential while the first driver drives said first terminal to the reference potential.

16. The circuit of claim 15, wherein the series of read potentials includes a first read potential, a second read potential, and the reference potential, the reference potential being intermediate between the first read potential and the second read potential.

17. The circuit of claim 16, wherein the reference potential is intermediate between the first read potential and the preliminary potential.

18. The circuit of claim 16, wherein the sensing unit compares the reference potential with the potential of said first terminal.

* * * * *